United States Patent
Lee et al.

(10) Patent No.: US 8,552,775 B2
(45) Date of Patent: Oct. 8, 2013

(54) DIGITAL PHASE-LOCKED LOOP APPARATUS USING FREQUENCY SHIFT KEYING AND METHOD OF CONTROLLING THE SAME

(75) Inventors: Seung Sik Lee, Daejeon (KR); Sangsung Choi, Daejeon (KR); Young Ae Jeon, Daejeon (KR); Sangjae Lee, Daejeon (KR); Byoung Hak Kim, Daejeon (KR); Mi Kyung Oh, Daejeon (KR); Cheol-ho Shin, Daejeon (KR); Kang-yoon Lee, Seoul (KR); YoungGun Pu, Seoul (KR); Joon-Sung Park, Seoul (KR)

(73) Assignees: Electronics and Telecommunications Research Institute, Daejeon (KR); Konkuk University Industrial Cooperation Corp., Seoul (KR)

( * ) Notice: Subject to any disclaimer, the term of this patent is extended or adjusted under 35 U.S.C. 154(b) by 0 days.

(21) Appl. No.: 13/589,629

(22) Filed: Aug. 20, 2012

(65) Prior Publication Data
US 2013/0043920 A1 Feb. 21, 2013

(30) Foreign Application Priority Data
Aug. 19, 2011 (KR) .................. 10-2011-0082672

(51) Int. Cl.
*H03L 7/06* (2006.01)
(52) U.S. Cl.
USPC ........................................ 327/159
(58) Field of Classification Search
USPC ............ 327/147–159; 375/373–376; 331/1 R
See application file for complete search history.

(56) References Cited

U.S. PATENT DOCUMENTS

| | | | |
|---|---|---|---|
| 6,801,784 B1 * | 10/2004 | Rozenblit et al. | 455/522 |
| 8,432,231 B2 * | 4/2013 | Nelson et al. | 331/34 |
| 2008/0317188 A1 | 12/2008 | Staszewski et al. | |
| 2009/0175399 A1 | 7/2009 | Sun et al. | |
| 2009/0267664 A1 | 10/2009 | Uozumi et al. | |

FOREIGN PATENT DOCUMENTS

KR   1020100099754   9/2010

OTHER PUBLICATIONS

Liu, Yao-Hong et al., "A Wideband PLL-Based G/FSK Transmitter in 0.18 mu m CMOS," IEEE Journal of Solid-State Circuits, vol. 44(9):2452-2462 (2009).
Park, Bonghyuk et al., "A 3.1 to 5 GHz CMOS Transceiver for DS-UWB Systems," ETRI Journal, vol. 29(4):421-429 (2007).

* cited by examiner

*Primary Examiner* — Lincoln Donovan
*Assistant Examiner* — Sibin Chen
(74) *Attorney, Agent, or Firm* — Nelson Mullins Riley & Scarborough LLP (57) ABSTRACT

A digital phase-locked loop apparatus using FSK includes a PFD detecting phase differences between a reference clock and a frequency-divided signal, and a first adder for generating first digital control codes by adding first digital codes, second digital codes, and channel frequency codes including channel information to each other, the first digital codes being converted from time differences between first and second pulses. The apparatus further includes a digital filter correcting errors of the first digital control codes to generate second digital control codes, a DCO for varying an oscillating frequency in accordance with a digital tuning word based on the second digital control codes, and a dual modulus division unit dividing the oscillating frequency into a frequency-divided signal.

20 Claims, 9 Drawing Sheets

OUTPUT OF DCO

FIG.5B

DATA

FIG.5C

OUTPUT OF DIGITAL
PHASE-LOCKED LOOP CIRCUIT

FIG. 6

OUTPUT SPECTRUM OF DCO

*FIG. 7*

CLOSED-LOOP PHASE NOISE

FIG.8A

PLL OUTPUT SPECTRUM

*FIG.8B*

PLL OUTPUT PHASE NOISE

DIGITAL PHASE-LOCKED LOOP APPARATUS USING FREQUENCY SHIFT KEYING AND METHOD OF CONTROLLING THE SAME

RELATED APPLICATION(S)

This application claims the benefit of Korean Patent Application No. 10-2011-0082672, filed on Aug. 19, 2011, which is hereby incorporated by references as if fully set forth herein.

FIELD OF THE INVENTION

The present invention relates to a phase-locked loop apparatus which operates using a digital method, rather than an existing analog method, so as to perform Frequency Shift Keying (FSK) at a transmitting stage and, more particularly, to a digital phase-locked loop apparatus using FSK and a method of controlling the same, which are capable of reducing additional circuits and flexibly selecting a channel by receiving the data of a transmitter as input to the digital phase-locked loop apparatus and then performing frequency shifting on the data.

BACKGROUND OF THE INVENTION

The implementation of a transceiver capable of reducing power consumption in wireless communication and being flexibly used in many applications has become a recent issue. To meet this issue, a variety of FSK methods have been proposed.

In order to implement FSK in a transmitter, an analog phase-locked loop apparatus is commonly used. When the analog phase-locked loop circuit is used, a variety of buffers for appropriately transferring signals are required because an analog signal level is an important factor.

This may become a cause of increased current consumption. Furthermore, since almost all circuit blocks must be redesigned when a process is varied or scaled down because the analog phase-locked loop is very sensitive to a process, the time and cost are increased.

Furthermore, there is a limitation to a part that reduces in-band noise from among the phase noise of the analog phase-locked loop circuit. In general, the channel of the oscillating frequency of the analog phase-locked loop circuit is varied using a divider and a counter. In this case, a lot of current is consumed because the blocks must operate at a high speed.

SUMMARY OF THE INVENTION

In view of the above, the present invention provides a digital phase-locked loop apparatus and a method of controlling the same, which are capable of easily enabling FSK using the digital phase-locked loop apparatus when a transmitter and a receiver are implemented using FSK in a wireless communication system.

Further, the present invention provides a digital phase-locked loop apparatus and a method of controlling the same, which are capable of flexibly varying the channel of an output frequency without an additional apparatus when the channel is varied.

Yet another object of the present invention is to provide a digital phase-locked loop apparatus and a method of controlling the same, which are capable of reducing time and costs by providing flexibility when a process used in a final circuit is varied or scaled down.

In accordance with an aspect of the present invention, there is provided a digital phase-locked loop apparatus using Frequency Shift Keying (FSK), comprising: a Phase-Frequency Detector (PFD) for detecting phase differences between a reference clock and a frequency-divided signal; a pulse generator for generating first and second pulses based on results of the detection of the phase differences of the PFD; a Time to Digital Converter (TDC) for converting time differences between the first and second pulses into first digital codes by comparing rising edges of the first and second pulses of the pulse generator with each other; a first Sigma-Delta Modulator (SDM) for modulating external data into second digital codes; a first adder for generating first digital control codes by adding the first digital codes, the second digital codes, and channel frequency codes including channel information to each other; a digital filter for correcting errors of the first digital control codes generated by the first adder and then generating second digital control codes; a Digitally Controlled Oscillator (DCO) for varying an oscillating frequency in accordance with a digital tuning word based on the second digital control codes of the digital filter; and a Dual modulus division unit for dividing the oscillating frequency, varied by the DCO, into a frequency-divided signal.

The digital phase-locked loop apparatus may include a second SDM for modulating the second digital control codes into third digital codes; and a second adder for generating the digital tuning word by adding the third digital control codes modulated by the second SDM and the second digital control codes generated by the digital filter to each other, and applying the generated digital tuning word to the DCO.

Further, the digital phase-locked loop apparatus may include a modulus controller for dividing the oscillating frequency into the frequency-divided signal by varying an output value based on the channel frequency codes.

The PFD may compare a phase and frequency of the frequency-divided signal with those of the reference clock and outputs an up signal or a down signal.

The up signal may be a signal indicative of phase differences when the reference clock has a higher frequency than the frequency-divided signal.

The down signal may be a signal indicative of phase differences when the reference clock has a lower frequency than the frequency-divided signal.

The PFD may generate a reset delay signal for resetting the up signal and the down signal.

The pulse generator may remove the reset delay signal from the output value of the PFD by performing digital operation processing.

The TDC may be configured to be of a time amplifying and SAR type so as to amplify the time differences between the first pulse and the second pulse.

Further, the TDC may comprise; a clock generator for generating a clock; a Time Amplifier (TA) for amplifying the time differences between the rising edges of the first pulse and the second pulse along a time axis; and flip-flops for storing the first digital codes.

The DCO may have a basic output frequency of 0.92 GHz.

The reference clock may be 20 MHz.

In accordance with another aspect of the present invention, there is provided a method of controlling the digital phase-locked loop apparatus using FSK, comprising: generating a frequency signal based on digital control oscillation; dividing the frequency signal based on a dual modulus division ratio; detecting phase differences between a reference clock and a frequency-divided signal based on the division ratio; converting a signal indicative of the detected phase differences into a first pulse signal and a second pulse signal; generating first digital codes by measuring time differences between rising edges of the first pulse signal and the second pulse signal; generating first digital control codes by adding the first digital codes, second digital codes subjected to a primary sigma-delta modulation process, and channel frequency codes to each other; removing noise from the first digital control codes and generating second digital control codes; and applying a secondary sigma-delta modulation process to the second digital control codes and then generating a digital tuning word by performing addition again.

Further, the method may include scaling the first digital control codes based on an input range of the digital control oscillation.

The detecting phase differences between a reference clock and a frequency-divided signal may include generating a down signal when the frequency-divided signal has a higher frequency than the reference clock.

Further, the detecting phase differences between a reference clock and a frequency-divided signal may include generating an up signal when the frequency-divided signal has a lower frequency than the reference clock.

The time differences between the first pulse signal and the second pulse signal may be amplified using a time amplifying and Successive Approximation (SAR) type.

The method may be repeated until the phase differences between the reference clock and the frequency-divided signal become 0.

Further, the method may include sending a frequency signal based on the digital control oscillation until the phase differences between the reference clock and the frequency-divided signal become 0.

BRIEF DESCRIPTION OF THE DRAWINGS

The objects and features of the present invention will become apparent from the following description of preferred embodiments given in conjunction with the accompanying drawings, in which.

DETAILED DESCRIPTION OF THE PREFERRED EMBODIMENTS

Embodiments of the present invention will be described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

In the following description of the present invention, if the detailed description of the already known structure and operation may confuse the subject matter of the present invention, the detailed description thereof will be omitted. The following terms are terminologies defined by considering functions in the embodiments of the present invention and may be changed operators intend for the invention and practice. Hence, the terms need to be defined throughout the description of the present invention.

Combinations of each step in respective blocks of block diagrams and a sequence diagram attached herein may be carried out by computer program instructions. Since the computer program instructions may be loaded in processors of a general purpose computer, a special purpose computer, or other programmable data processing apparatus, the instructions, carried out by the processor of the computer or other programmable data processing apparatus, create devices for performing functions described in the respective blocks of the block diagrams or in the respective steps of the sequence diagram. Since the computer program instructions, in order to implement functions in specific manner, may be stored in a memory useable or readable by a computer aiming for a computer or other programmable data processing apparatus, the instruction stored in the memory useable or readable by a computer may produce manufacturing items including an instruction device for performing functions described in the respective blocks of the block diagrams and in the respective steps of the sequence diagram. Since the computer program instructions may be loaded in a computer or other programmable data processing apparatus, instructions, a series of processing steps of which is executed in a computer or other programmable data processing apparatus to create processes executed by a computer so as to operate a computer or other programmable data processing apparatus, may provide steps for executing functions described in the respective blocks of the block diagrams and the respective sequences of the sequence diagram.

Moreover, the respective blocks or the respective sequences may indicate modules, segments, or some of codes including at least one executable instruction for executing a specific logical function(s). In several alternative embodiments, is noticed that functions described in the blocks or the sequences may run out of order. For example, two successive blocks and sequences may be substantially executed simultaneously or often in reverse order according to corresponding functions.

Figure 1:
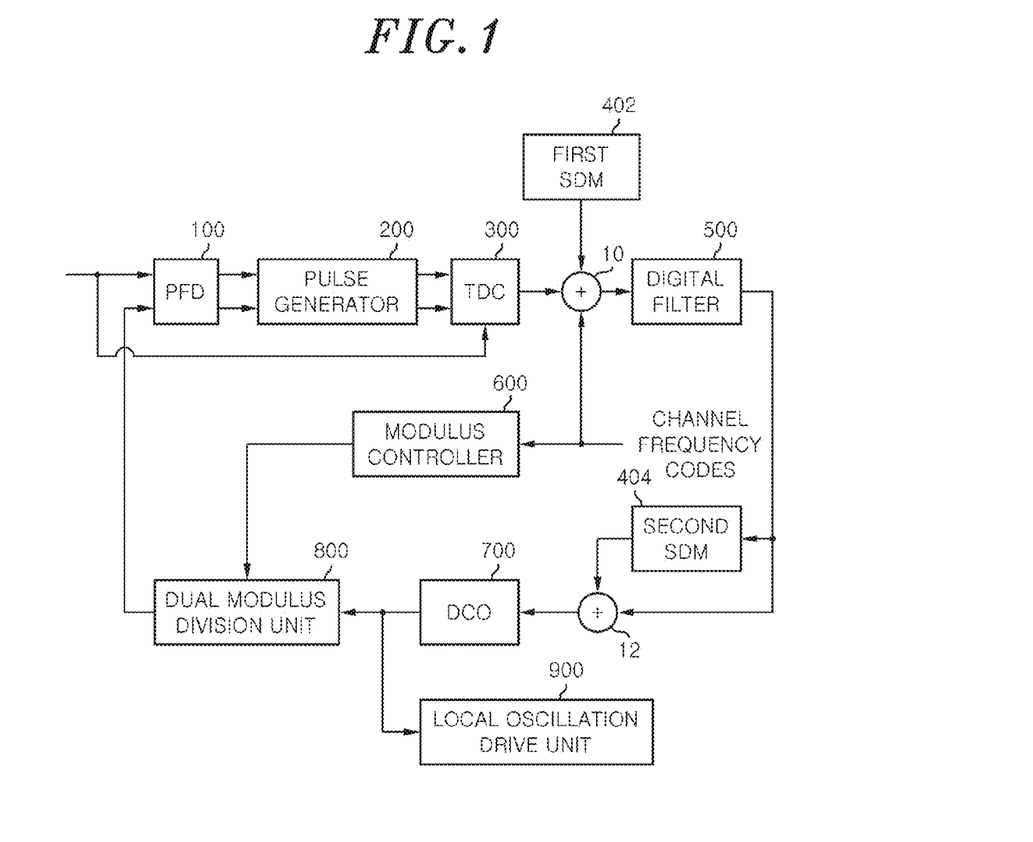
FIG. 1 is a block diagram illustrating the configuration of a digital phase-locked loop apparatus using FSK in accordance with an embodiment of the present invention.

A digital phase-locked loop apparatus using FSK in accordance with the present invention may include a Phase-Frequency Detector (PFD) for comparing the frequency and phase of a reference clock REF_CLK with those of a Digitally Controlled Oscillator (DCO), a pulse generator for generating two output pulses Pulse_A and Pulse_B based on the results of the frequency and phase comparison of the PFD, a Time to Digital Converter (TDC) for comparing the rising edges of the two output pulses generated by the pulse generator and converting time differences therebetween into digital codes, a Sigma-Delta Modulator (SDM) for modulating data output from a modem (not shown) while converting the received data into digital codes, a digital filter for correcting the one or more errors of the digital codes and converting the digital codes into the input levels of the DCO, the DCO for receiving the digital codes and converting the oscillating frequency of the received digital codes, a Dual modulus division unit for varying a division ratio based on the received digital codes, and a modulus controller for varying the received digital codes in accordance with a channel frequency.

Figure 3:
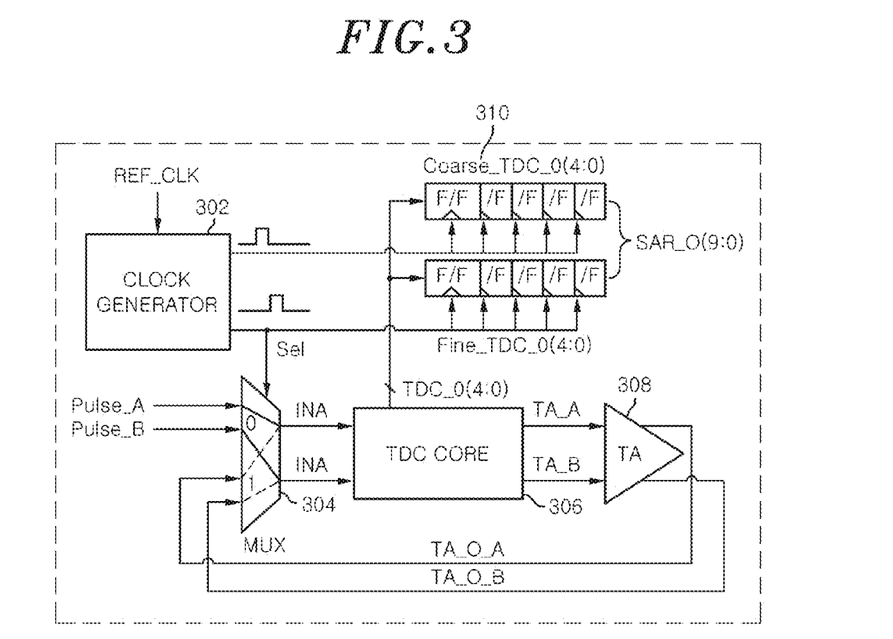
FIG. 3 is a detailed block diagram of the Time to Digital Converter (TDC) of FIG. 1.

Here, the TDC may include a clock generator for receiving the reference clock and then generating another clock signal, flip-flops for receiving the clock signal, a multiplexer (MUX) for varying the type of input signal in response to the clock signal, a TDC core for receiving the output of the MUX and converting the received output into digital codes in response to the rising edges of two signals, and a Timing Amplifier (TA) for receiving the output of the TDC core and amplifying the output along a time axis.

FIG. 1 is a block diagram illustrating the configuration of a digital phase-locked loop apparatus using FSK in accordance with an embodiment of the present invention. The digital phase-locked loop apparatus may include a PFD 100, a pulse generator 200, a TDC 300, a first SDM 402, a second SDM 404, a digital filter 500, a modulus controller 600, a DCO 700, a dual modulus division unit 800, and a local oscillation drive unit 900.

As shown in FIG. 1, the PFD 100 may function to receive a reference clock REF_CKL and a signal divided by the Dual modulus division unit 800, to compare the phase and frequency of one of the two signals (i.e., the frequency-divided signal and the reference signal) with those of the other, and to generate an up signal and a down signal. Furthermore, the PFD 100 may generate a reset delay signal which resets the up signal and the down signal.

Figure 2A:
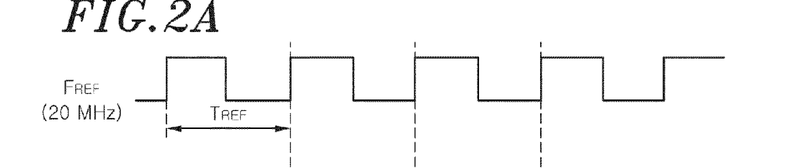
FIGS. 2A to 2F illustrate a diagram showing examples of the output waveforms of the PFD and pulse generator of the digital phase-locked loop apparatus in accordance with the embodiment of the present invention.

FIGS. 2A to 2F show examples of the output waveforms of the PFD 100 and the pulse generator 200 in the digital phase-locked loop apparatus in accordance with the embodiment of the present invention. In FIG. 2A may show the reference clock REF_CLK, FIG. 2B may show a signal which has been subjected to the division of the Dual modulus division unit 800, FIG. 2C may show the up signal of the PFD 100, FIG. 2D may show the down signal of the PFD 100, FIG. 2E may show the output pulse A of the pulse generator 200, FIG. 2F may show the output pulse B of the pulse generator 200. In FIG. 2, a reference numeral 20 may show the time differences between the rising edges of FIGS. 2E and 2F.

Figure 2B:
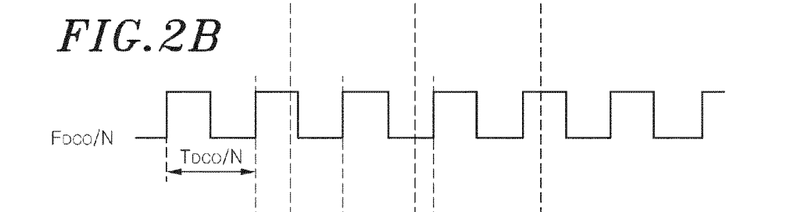
Figure 2C:
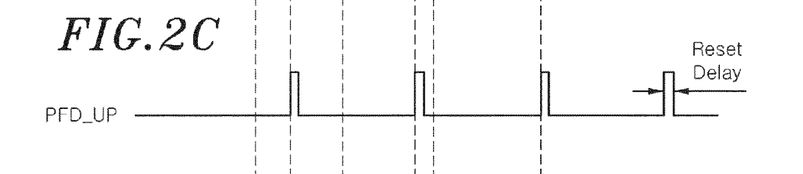
Figure 2D:
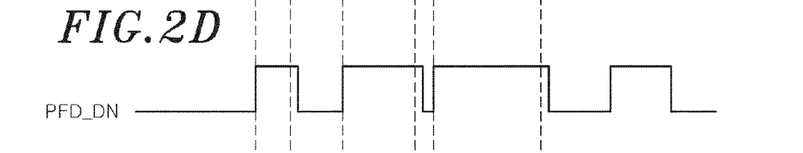

As shown, the up signal of the PFD 100 in FIG. 2C is representative of corresponding phase differences when the reference clock in FIG. 2A has a higher frequency than the frequency-divided signal, and the down signal of the PFD 100 in FIG. 2D is representative of corresponding phase differences when the reference clock in FIG. 2A has a lower frequency than the frequency-divided signal.

Here, the phase differences may be representative of time differences between the clock cycles of the up or down signal and the frequency-divided signal.

Figure 2E:
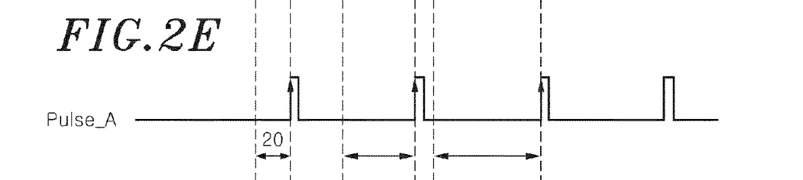
Figure 2F:
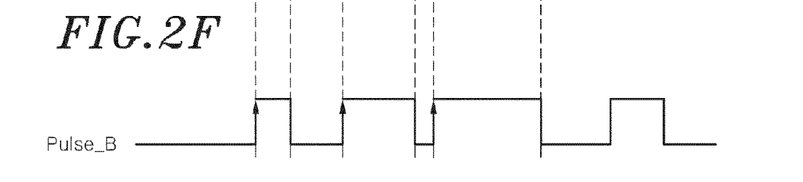

The pulse generator 200 functions to convert the up signal in FIG. 2C and the down signal in FIG. 2D, received from the PFD 100, into the two output pulses in FIGS. 2E and 2F by performing operation processing on the up signal in FIG. 2C and the down signal in FIG. 2D so that the TDC 300 may make a comparison therebetween. That is, the pulse generator 200 may function to generate the two output pulses in FIGS. 2E and 2F by converting the up signal in FIG. 2C and the down signal in FIG. 2D, received from the PFD 100, into the two output pulses in FIGS. 2E and 2F so that the TDC 300 may search for a signal having phase differences 20, that is, the time differences. Furthermore, the pulse generator 200 may function to remove the reset delay signal from the output value of the PFD 100 using digital operation processing, and to newly generate phase differences in accordance with the input of the TDC 300.

The TDC 300 may function to convert the time differences 20, obtained using the two output pulses in FIGS. 2E and 2F calculated by the pulse generator 200, into digital codes. Here, the TDC 300 may be configured to be of a time amplifying and Successive Approximation (SAR) type so as to amplify the time differences 20 between the two output pulses in FIGS. 2E and 2F for the purpose of low power and high resolution output. As shown in FIG. 3, the TDC 300 may include a clock generator 302, a MUX 304, a TDC core 306, a TA 308, and flip-flops 310.

Signals input to the TDC 300 may be represented by Pulse_A in FIG. 2E and Pulse_B in FIG. 2F. The time differences 20 between the rising edges of Pulse_A in FIG. 2E and Pulse_B in FIG. 2F may be configured to be identical with the time differences between the frequency-divided signal in FIG. 2B and the reference clock REF_CKL in FIG. 2A.

The TDC 300 may function to receive Pulse_A in FIG. 2E and Pulse_B in FIG. 2F, and to convert the time differences between the rising edges of the two signals into the digital codes, for example, binary codes. The digital codes converted by the TDC 300 may be stored in the flip-flops 310.

Here, the time differences 20 between the rising edges of Pulse_A in FIG. 2E and Pulse_B in FIG. 2F may be transferred to the TA 308. The TA 308 may function to amplify the time differences 20 between the rising edges along a time axis.

When the TA 308 amplifies the time differences 20 between the rising edges along a time axis, the control signal of the MUX 304 functions to receive a signal from the clock generator 302, to block the signals Pulse_A in FIG. 2E and Pulse_B in FIG. 2F, and to transfer signals TA_O_A and TA_O_B, that is, the outputs of the TA 308, to the TDC core 306 again.

The TDC core 306 which has received the amplified signals TA_O_A and TA_O_B from the TA 308 outputs the differences between the two signals again, converts the differences into binary digital codes, and stores the binary digital codes in the flip-flops 310.

Meanwhile, the first SDM 402 may modulate external input data into second digital codes, and apply the second digital codes to a first adder 10.

The first adder 10 may generate first digital control codes by adding the first digital codes received from the TDC 300, the second digital codes received from the first SDM 402, and channel frequency codes including channel information to each other.

The first digital control codes may be applied to the digital filter 500. The digital filter 500 converts the first digital control codes into second digital control codes in accordance with the input levels of the second SDM 404 and the DCO 700. That is, the digital filter 500 may function to correct the errors of the first digital control codes, and convert the first digital control codes into the second digital control codes in accordance with the input level of the DCO 700.

The second digital control codes output from the digital filter 500 may be applied to the second SDM 404 and a second adder 12. The second digital control codes passed through the second SDM 404 may be modulated into third digital control codes and then applied to the second adder 12.

Accordingly, the second adder 12 may generate a digital tuning word by adding the second digital control codes received from the digital filter 500 and the third digital control codes modulated by the second SDM 404 to each other.

The DCO 700 may function to receive the digital tuning word, and vary the frequency of a clock oscillating based on the digital tuning word.

The dual modulus division unit 800 may function to divide the frequency of the clock received from the DCO 700. That is, the output value of the modulus controller 600 is varied depending on channel frequency codes, and the Dual modulus division unit 800 may receive the converted output value of the modulus controller 600 and vary a division ratio.

The local oscillation drive unit 900 may function to control the magnitude of a signal output from the DCO 700. For example, the local oscillation drive unit 900 may control the magnitude of a signal by reducing the magnitude of the signal if the magnitude of the signal is high and increasing the magnitude of the signal if the magnitude of the signal is low so that the signal having constant magnitude can be transmitted.

Figure 4:
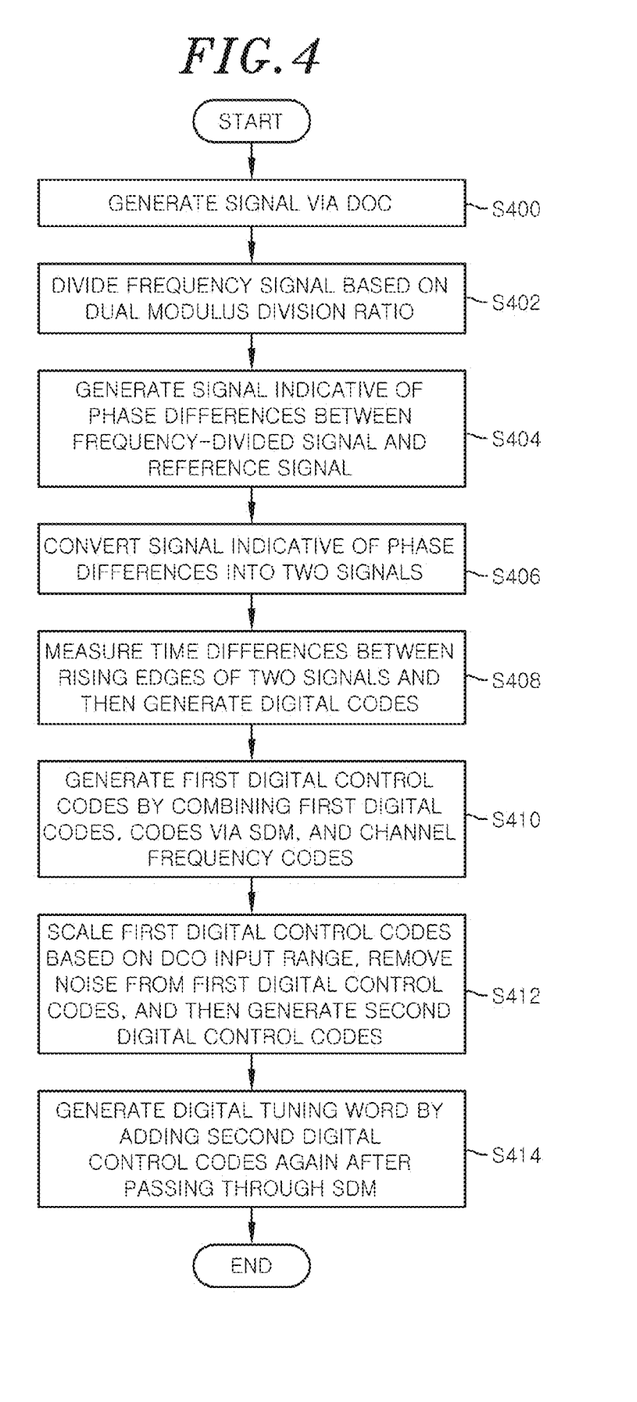
FIG. 4 is a flowchart illustrating a method of controlling the digital phase-locked loop apparatus in accordance with an embodiment of the present invention.

FIG. 4 is a flowchart illustrating a method of controlling the digital phase-locked loop apparatus in accordance with an embodiment of the present invention. A process of controlling the digital phase-locked loop apparatus in accordance with the embodiment of the present invention will now be described in conjunction with the output waveforms of FIG. 2.

As shown in FIG. 4, at step S400, a corresponding frequency signal may be generated by inputting a digital tuning word to the DCO 700. For example, although the basic output frequency of the DCO 700 may vary depending on the characteristics and standard of a system, it is assumed for ease of description that the basic output frequency of the DCO 700 is 0.92 GHz.

It is also assumed that a frequency higher than the basic output frequency 0.92 GHz is output from the DCO 700, the division ratio of the Dual modulus division unit 800 is 46, and the reference clock in FIG. 2A is 20 MHz. However, they may also vary depending on the characteristics and standard of the system.

Thereafter, at step S402, the frequency output of the DCO 700 may be supplied to the Dual modulus division unit 800, and thus the frequency-divided signal in FIG. 2B having a division ratio of 46 may be generated.

The generated frequency-divided signal in FIG. 2B may be applied to the PFD 100. The PFD 100 may generate a signal indicative of the phase differences between the frequency-divided signal in FIG. 2B and the reference clock in FIG. 2A by comparing the frequency-divided signal in FIG. 2B and the reference clock in FIG. 2A, at step S404. In this embodiment of the present invention, it is assumed that the output frequency of the DCO 700 is higher than the basic frequency, and therefore the signal indicative of the phase differences may be generated as the down signal in FIG. 2D. Here, the up signal in FIG. 2C may be represented by a reset delay signal for reset. The reset delay signal may be included in both the up signal in FIG. 2C and the down signal in FIG. 2D.

At step S406, the pulse generator 200 may perform XOR operation processing on the up signal in FIG. 2C and the down signal in FIG. 2D. Furthermore, the pulse generator 200 may generate Pulse_B in FIG. 2F by removing the reset delay signal, and generate Pulse_A in FIG. 2E using the up signal in FIG. 2C.

At step S408, the TDC 300 may convert the differences (i.e., the time differences) between the rising edges of Pulse_A in FIG. 2E and Pulse_B in FIG. 2F into first digital codes. In this embodiment of the present invention, the time amplifying and SAR type may be used in order to increase resolution and reduce power and area.

At step S410, the first digital codes which are output after time measurement, second digital codes into which external data is modulated while passing through the first SDM 402, and external channel frequency codes may be input to the first adder 10. The first digital codes, the second digital codes, and the channel frequency codes may be added and converted into first digital control codes.

At step S412, the first digital control codes may be scaled in accordance with the input level of the DCO 700 while passing through the digital filter 500. After code noise is removed from the first digital control codes, the first digital control codes may be converted into second digital control codes.

Thereafter, the second digital control codes may be applied to the second SDM 404 and the second adder 12. The second digital control codes may be modulated into third digital control codes while passing through the second SDM 404 and then applied to the second adder 12. Accordingly, the second digital control codes received from the digital filter 500 and the third digital control codes modulated while passing through the second SDM 404 may be added by the second adder 12, thereby being generated as a digital tuning word at step S414.

The digital tuning word is fed back to step S400 and then input to the DCO 700, and thus a corresponding frequency signal may be generated.

The above-described steps may be repeated until the phase differences between the reference clock in FIG. 2A and the frequency-divided signal in FIG. 2B become 0. Furthermore, when the phase differences become 0, a desired frequency can be generated through the DCO 700. The above-described external data is carried on the generated frequency and then transmitted.

Figure 5A:
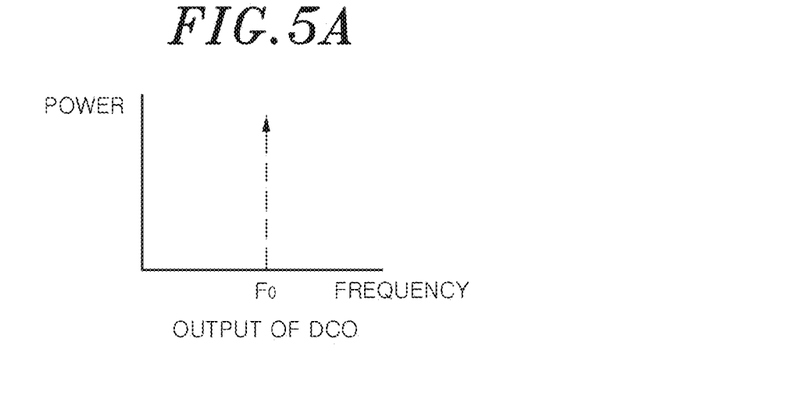
FIG. 5 is a diagram illustrating the output waveform of the digital phase-locked loop apparatus when FSK is applied thereto in accordance with the embodiment of the present invention.
Figure 5B:
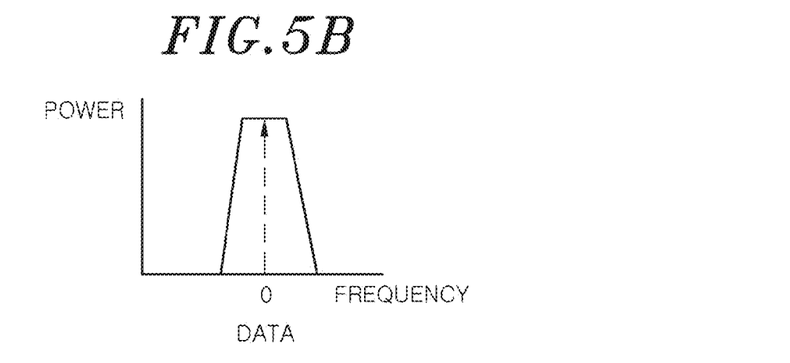
Figure 5C:
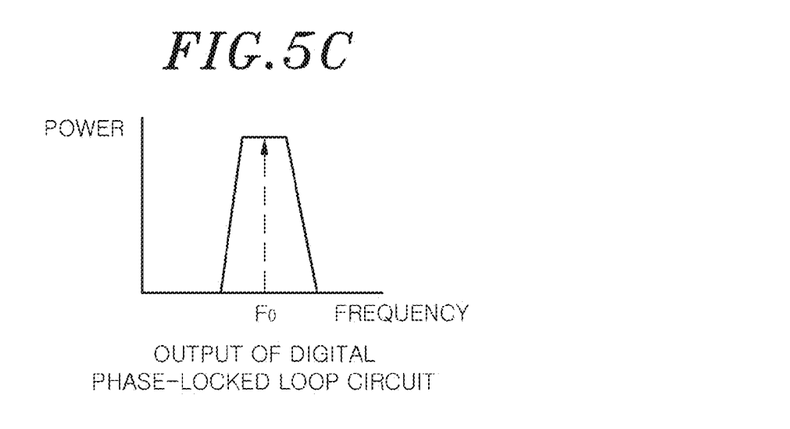
Figure 6:
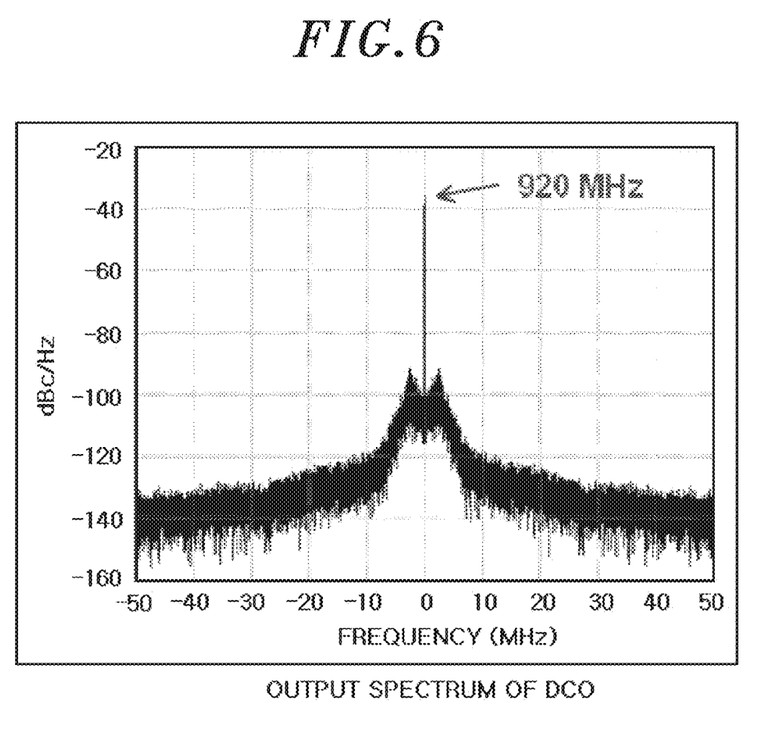
FIG. 6 is a diagram illustrating the output waveform of the digital phase-locked loop apparatus when data input to a first SDM is 0.

FIGS. 5 and 6 show output waveforms illustrating the operation of the digital phase-locked loop apparatus in accordance with the embodiment of the present invention.

First, FIG. 5 is a diagram illustrating the output waveform of the digital phase-locked loop circuit when FSK is applied thereto.

If external data has a frequency spectrum, such as that shown in FIG. 5, on the assumption that the oscillating frequency of the digital phase-locked loop apparatus is $F_0$, the FSK output of the digital phase-locked loop apparatus may correspond to the addition of the spectrum of the external data to the $F_0$ frequency.

Furthermore, FIG. 6 illustrates the output waveform of the digital phase-locked loop apparatus when external data is 0. From FIG. 6, it can be seen that the output waveform is locked at 0.92 GHz, that is, the basic frequency of the digital phase-locked loop apparatus.

Figure 7:
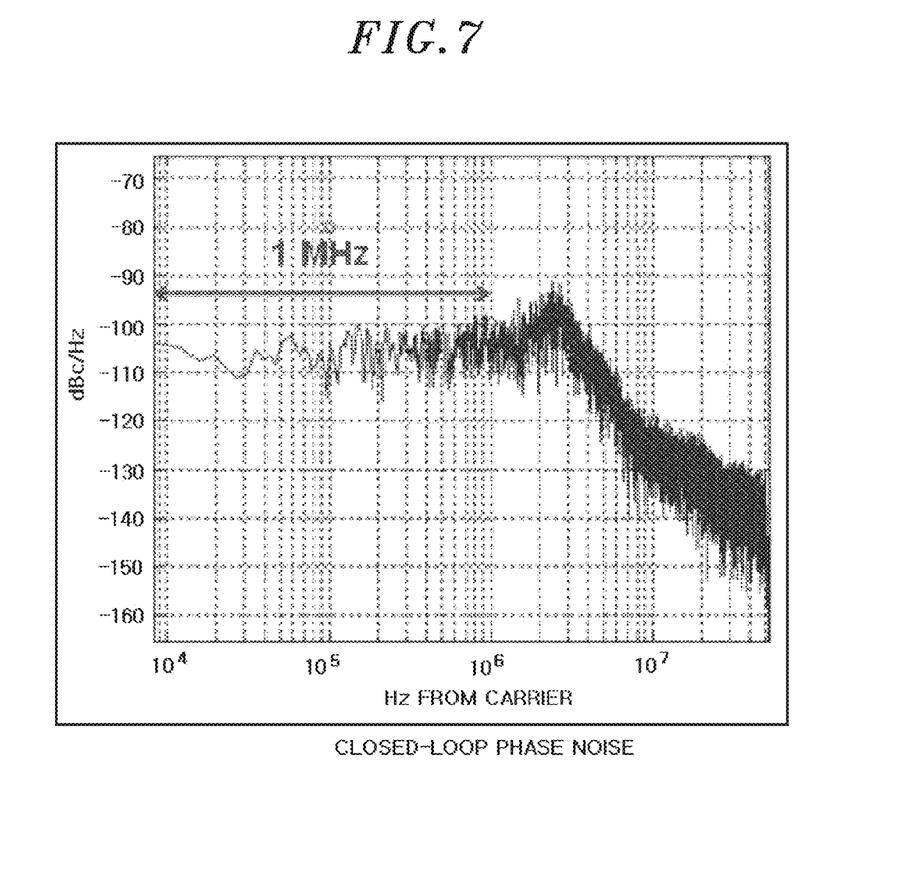
FIG. 7 is a diagram illustrating the output phase noise waveform of the digital phase-locked loop apparatus in accordance with the embodiment of the present invention.

FIG. 7 illustrates the phase noise waveform of the digital phase-locked loop apparatus in accordance with the embodiment of the present invention. From FIG. 7, it can be seen that in-band phase noise has performance of −105 dBc/Hz at 10 kHz.

Figure 8A:
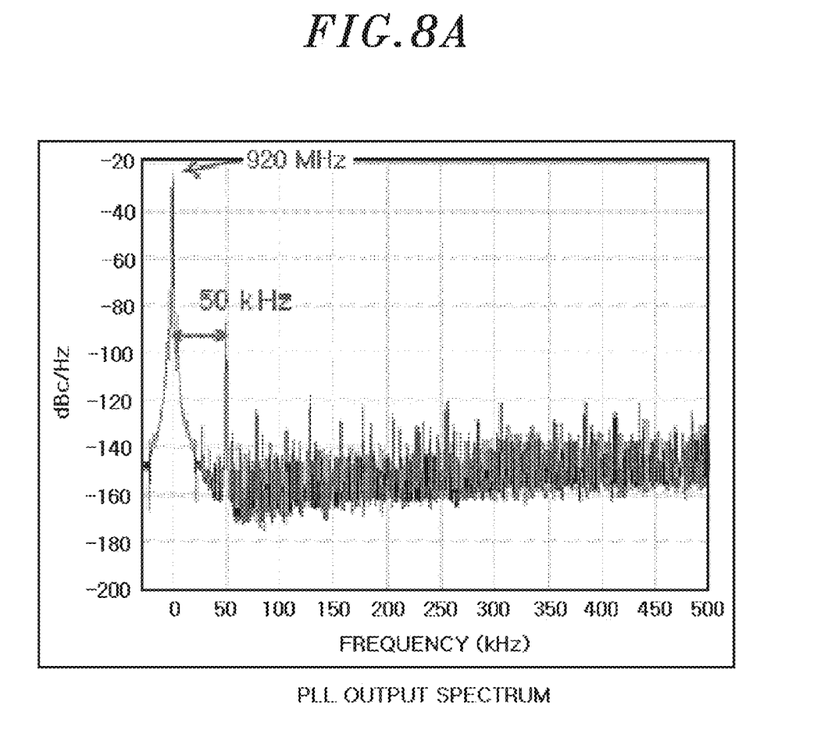
FIGS. 8A and 8B illustrate output waveforms of the digital phase-locked loop apparatus when two tones are applied in accordance with the embodiment of the present invention.
Figure 8B:
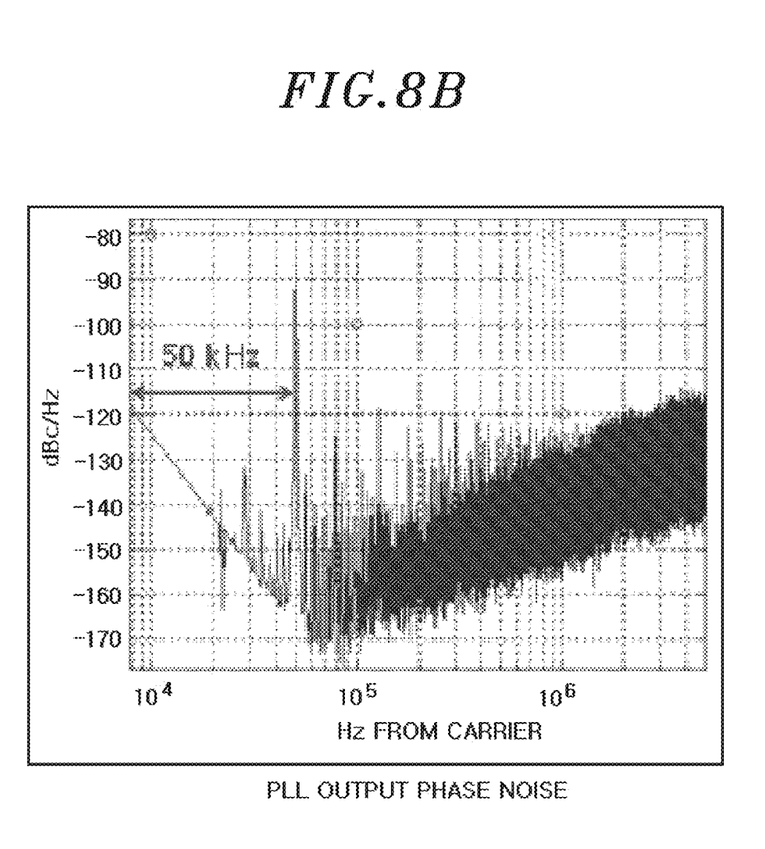

FIGS. 8A and 8B show output spectrums when modulation is performed on the digital phase-locked loop apparatus in accordance with the embodiment of the present invention.

For example, assuming that the basic frequency is 0.92 GHz and external data has a frequency of 50 kHz, it can be seen that the two tones 0.92 GHz and 0.92 GHz+50 kHz are found in the output spectrums.

As described above, in accordance with the embodiments of the present invention, when a transmitter and a receiver are implemented using FSK in a wireless communication system, FSK may be facilitated by using the digital phase-locked loop apparatus. Furthermore, in the embodiments of the present invention, the digital phase-locked loop apparatus using FSK is implemented in which the output frequency may be flexibly varied without an additional apparatus when the channel of an output frequency is varied and in which the time and cost can be reduced by providing flexibility when the operating process of a final apparatus is varied or the final circuit is scaled down.

While the invention has been shown and described with respect to the preferred embodiments, the present invention is not limited thereto. It will be understood by those skilled in the art that various changes and modifications may be made without departing from the scope of the invention as defined in the following claims.

What is claimed is:

1. A digital phase-locked loop apparatus using Frequency Shift Keying (FSK), comprising:
    a Phase-Frequency Detector (PFD) for detecting phase differences between a reference clock and a frequency-divided signal;
    a pulse generator for generating first and second pulses based on results of the detection of the phase differences of the PFD;
    a Time to Digital Converter (TDC) for converting time differences between the first and second pulses into first digital codes by comparing rising edges of the first and second pulses of the pulse generator with each other;
    a first Sigma-Delta Modulator (SDM) for modulating external data into second digital codes;
    a first adder for generating first digital control codes by adding the first digital codes, the second digital codes, and channel frequency codes including channel information to each other;
    a digital filter for correcting errors of the first digital control codes generated by the first adder and then generating second digital control codes;
    a Digitally Controlled Oscillator (DCO) for varying an oscillating frequency in accordance with a digital tuning word based on the second digital control codes of the digital filter; and
    a dual modulus division unit for dividing the oscillating frequency, varied by the DCO, into a frequency-divided signal.

2. The digital phase-locked loop apparatus of claim 1, further comprising:
    a second SDM for modulating the second digital control codes into third digital codes; and
    a second adder for generating the digital tuning word by adding the third digital control codes modulated by the second SDM and the second digital control codes generated by the digital filter to each other, and applying the generated digital tuning word to the DCO.

3. The digital phase-locked loop apparatus of claim 1, further comprising a modulus controller for dividing the oscillating frequency into the frequency-divided signal by varying an output value based on the channel frequency codes.

4. The digital phase-locked loop apparatus of claim 1, wherein the PFD compares a phase and frequency of the frequency-divided signal with those of the reference clock and outputs an up signal or a down signal.

5. The digital phase-locked loop apparatus of claim 4, wherein the up signal is a signal indicative of phase differences when the reference clock has a higher frequency than the frequency-divided signal.

6. The digital phase-locked loop apparatus of claim 4, wherein the down signal is a signal indicative of phase differences when the reference clock has a lower frequency than the frequency-divided signal.

7. The digital phase-locked loop apparatus of claim 4, wherein the PFD generates a reset delay signal for resetting the up signal and the down signal.

8. The digital phase-locked loop apparatus of claim 7, wherein the pulse generator removes the reset delay signal from the output value of the PFD by performing digital operation processing.

9. The digital phase-locked loop apparatus of claim 1, wherein the TDC is configured to be of a time amplifying and SAR type so as to amplify the time differences between the first pulse and the second pulse.

10. The digital phase-locked loop apparatus of claim 1, wherein the TDC comprises:
    a clock generator for generating a clock;
    a Time Amplifier (TA) for amplifying the time differences between the rising edges of the first pulse and the second pulse along a time axis; and
    flip-flops for storing the first digital codes.

11. The digital phase-locked loop apparatus of claim 1, wherein the DCO has a basic output frequency of 0.92 GHz.

12. The digital phase-locked loop apparatus of claim 1, wherein the reference clock is 20 MHz.

13. A method of controlling the digital phase-locked loop apparatus using FSK, comprising:
    generating a frequency signal based on digital control oscillation;
    dividing the frequency signal based on a dual modulus division ratio;
    detecting phase differences between a reference clock and a frequency-divided signal based on the division ratio;
    converting a signal indicative of the detected phase differences into a first pulse signal and a second pulse signal;
    generating first digital codes by measuring time differences between rising edges of the first pulse signal and the second pulse signal;
    generating first digital control codes by adding the first digital codes, second digital codes subjected to a primary sigma-delta modulation process, and channel frequency codes to each other;
    removing noise from the first digital control codes and generating second digital control codes; and
    applying a secondary sigma-delta modulation process to the second digital control codes and then generating a digital tuning word by performing addition again.

14. The method of claim 13, further comprising, after generating the digital tuning word, feeding back to the first step.

15. The method of claim 13, further comprising scaling the first digital control codes based on an input range of the digital control oscillation.

16. The method of claim 13, wherein said detecting phase differences between a reference clock and a frequency-divided signal comprises generating a down signal when the frequency-divided signal has a higher frequency than the reference clock.

17. The method of claim 13, wherein detecting phase differences between a reference clock and a frequency-divided signal comprises generating an up signal when the frequency-divided signal has a lower frequency than the reference clock.

18. The method of claim 13, wherein the time differences between the first pulse signal and the second pulse signal is amplified using a time amplifying and Successive Approximation (SAR) type.

19. The method of claim 13, wherein the method is repeated until the phase differences between the reference clock and the frequency-divided signal become 0.

20. The method of claim 19, further comprising sending a frequency signal based on the digital control oscillation until the phase differences between the reference clock and the frequency-divided signal become 0.

* * * * *